United States Patent
Högerl

(10) Patent No.: US 6,960,829 B2
(45) Date of Patent: Nov. 1, 2005

(54) METHOD FOR PRODUCING A SEMICONDUCTOR WAFER, SEMICONDUCTOR CHIP, AND INTERMEDIATE SEMICONDUCTOR PRODUCT

(75) Inventor: Jürgen Högerl, Regensburg (DE)

(73) Assignee: Infineon Technologies AG, Munich (DE)

( * ) Notice: Subject to any disclaimer, the term of this patent is extended or adjusted under 35 U.S.C. 154(b) by 86 days.

(21) Appl. No.: 10/402,811

(22) Filed: Mar. 28, 2003

(65) Prior Publication Data

US 2003/0186487 A1 Oct. 2, 2003

(30) Foreign Application Priority Data

Mar. 28, 2002 (DE) .......................... 102 14 329

(51) Int. Cl.[7] .......................... H01L 23/48; H01L 21/44
(52) U.S. Cl. ...................... 257/737; 257/750; 257/762; 438/612; 438/614
(58) Field of Search .............................. 257/737, 750, 257/762, 765, 766, 771

(56) References Cited

U.S. PATENT DOCUMENTS

| | | | |
|---|---|---|---|
| 3,767,397 A | * | 10/1973 | Akiyama .................... 430/312 |
| 5,851,911 A | | 12/1998 | Farnworth |
| 5,904,556 A | * | 5/1999 | Suzuki et al. ................ 438/623 |
| 6,573,598 B2 | * | 6/2003 | Ohuchi et al. .............. 257/734 |
| 2002/0022373 A1 | | 2/2002 | Lehr et al. |
| 2002/0084508 A1 | | 7/2002 | Le et al. |

FOREIGN PATENT DOCUMENTS

DE  199 26 107 C1  11/2000
DE  100 21 098 C1  9/2001

* cited by examiner

Primary Examiner—Ha Tran Nguyen
(74) Attorney, Agent, or Firm—Laurence A. Greenberg; Werner H. Stemer; Ralph E. Locher

(57) ABSTRACT

A semiconductor wafer is produced with an outer contact layer applied to the entire surface of an insulating layer and a rewiring layer embedded therein. At the same time, fuses are short-circuited. After the outer contact layer has been patterned and a passivation layer has been applied, outer contacts and short-circuit lines are uncovered. Outer contacts are introduced into passage openings in the passivation layer. The semiconductor structures are tested and predetermined short-circuit lines are interrupted. Then, the semiconductor wafer is diced into semiconductor chips.

21 Claims, 4 Drawing Sheets

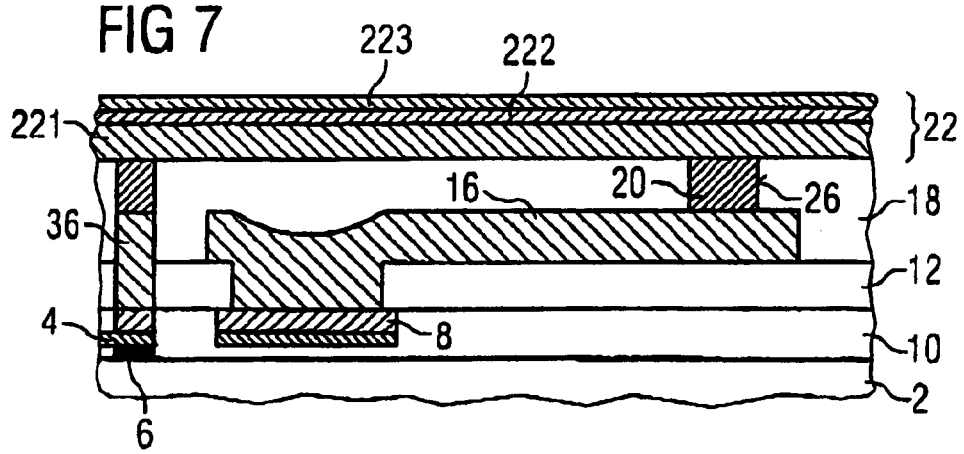
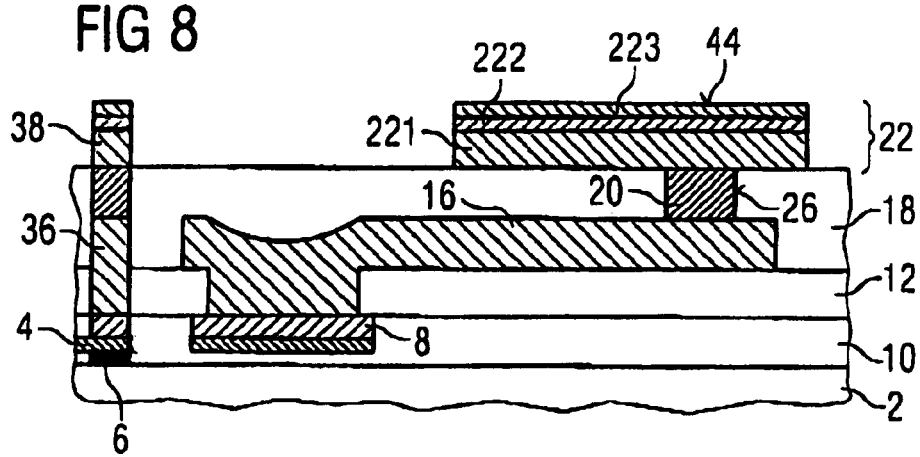
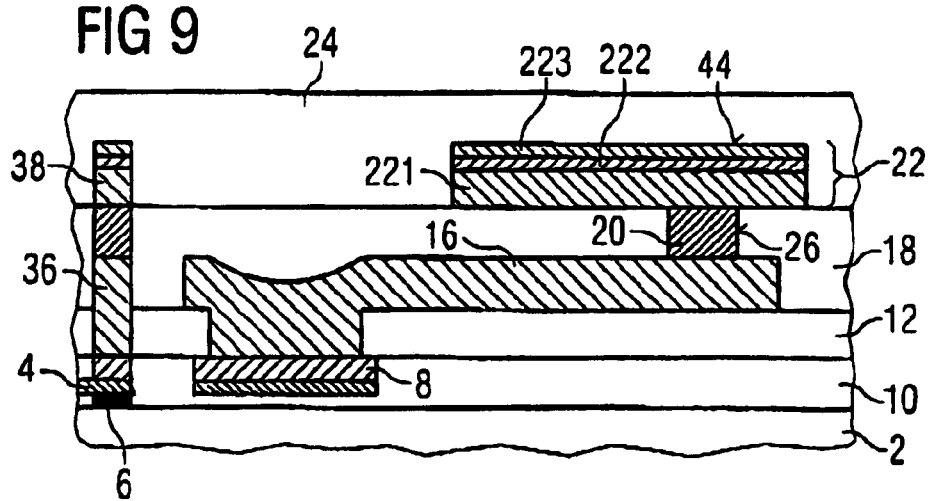

METHOD FOR PRODUCING A SEMICONDUCTOR WAFER, SEMICONDUCTOR CHIP, AND INTERMEDIATE SEMICONDUCTOR PRODUCT

BACKGROUND OF THE INVENTION

Field of the Invention

The invention relates to a method for producing a semiconductor wafer.

To produce semiconductor chips, semiconductor structures are applied to relatively large silicon wafers which are divided up in a subsequent method step. To subsequently make contact with circuit carriers arranged at a higher level and/or in order for the semiconductor chips to be stacked, they may be provided, for example, with contact surfaces. Thin wire connections or bonded connections are then fixed to the contact surfaces. That connection technique is also known as bonding. Another connection technique consists in creating contact surfaces which are large enough to receive contact bumps. The bumps consist, for example, of a solder paste. During semiconductor chip mounting, these bumps of soldering paste are partially melted as a result of the entire semiconductor chip being heated, with the result that the desired mechanical and electrical connections are produced. That mounting technique can also be referred to as the flip chip technique.

To produce the contact surfaces for the application of these solderable bumps, a metallic layer is applied after the semiconductor wafer has been cleaned. This is followed by coating with a passivation layer, after which an exposure step takes place in order to define the subsequent structures. After metallization of structures which have previously been exposed, further steps are carried out for local removal and etching of the metallization layer. The conductor structures obtained therefrom are then wired to form finished semiconductor modules in a bonding process.

A method for producing semiconductor structures with bumps for the electrical and mechanical connection of semiconductor chips is known, for example, from U.S. Pat. No. 5,851,911. The method is used in particular to produce contact bumps on a semiconductor wafer—which is subsequently to be separated (diced) into individual chips—for making contact by way of a flip chip technique. This involves direct mounting of the semiconductor chip provided with bumps on a printed circuit board. The fixed mechanical and electrical connection is then produced by way of a soldering process, in which the solderable bumps are heated to their melting point and form a form-fitting connection with the contacts on the printed circuit board.

If short-circuit lines or fuses are provided on the wafer, however, these have to be covered beforehand in order to avoid undesirable short-circuits. Fuses of this type are often used in semiconductor arrangements and are used, in the event of individual circuit elements or modules, such as for example memory cells, failing, to connect up corresponding replacement or redundant elements. For example, if a test of a semiconductor memory determines that a word line is defective, a redundant word line is activated instead of the defective word line as a result of fuses being interrupted or triggered. It is also possible, for example, to connect chip options by means of fuses. The separation can be effected, for example, by means of laser beam (a so-called laser fuse) or by electrical destruction resulting from the evolution of heat (what is known as an electrical or E fuse). Semiconductor arrangements of that type and methods for producing them are described in the commonly assigned published patent applications U.S. 2002/0084508 A1 (corresponding German patent DE 199 26 107 C1) and U.S. 2002/0022373 A1 (corresponding German patent DE 100 21 098 C1).

SUMMARY OF THE INVENTION

It is accordingly an object of the invention to provide a method of producing a semiconductor wafer, which overcomes the above-mentioned disadvantages of the heretofore-known devices and methods of this general type and which produces connecting planes on semiconductor wafers with short-circuit lines or fuses in such a manner that lower-cost and more economical production becomes possible.

With the foregoing and other objects in view there is provided, in accordance with the invention, a method for producing a semiconductor wafer having an active front surface provided with semiconductor structures and having a passive back surface without semiconductor structures, and having external contacts on the active front surface for electrically contacting semiconductor chips separated from the semiconductor wafer with contact surfaces of a circuit board or another circuit carrier, the outer contacts being formed on a metallic outer contact layer connected to semiconductor structures via underlying rewiring layers and interconnect layers, and the semiconductor structures having fuses formed as interruptible short circuit lines.

The novel method comprises the following steps:
providing a semiconductor wafer having semiconductor structures arranged in rows and columns and kerf regions therebetween;
forming an interconnect layer on a plane above the semiconductor structures, the interconnect layer having a multiplicity of interconnects connected to electrodes of the semiconductor structures;
embedding the interconnect layer in a first insulating layer, leaving clear contact surfaces;
applying a rewiring layer in a plane above the interconnect layer, on a structured, second insulating layer, comprising a multiplicity of rewiring tracks connected to the interconnect layer;
applying a third insulating layer having second apertures;
filling the second apertures with metal and producing short circuit lines;
applying a three-layer outer contact layer composed of three individual layers;
patterning the three-layer outer contact layer to form outer contact surfaces, rewiring lines, and short-circuit lines;
applying a passivation layer over the third insulating layer and the outer contact layer;
partly opening the passivation layer to the underlying outer contact layer to uncover the outer contact surfaces and the short-circuit lines;
applying outer contacts to the outer contact surfaces;
functionally testing the semiconductor structures and interrupting short-circuit lines having been detected; and
separating the semiconductor wafer into semiconductor chips.

In accordance with another feature of the invention, the three individual layers of the outer contact layer are formed by applying three metallic layers to an entire surface of the semiconductor wafer.

In other words, the semiconductor wafer which is produced using the process according to the invention has an active front surface provided with semiconductor structures and a passive back surface without semiconductor structures. On the active front surface there are outer contacts for making electrical contact between semiconductor chips, which have been separated from the semiconductor wafer, and contact surfaces of a printed circuit board or other circuit carrier arranged at a higher level. These outer contacts are applied to a metallic outer contact layer which is connected to the semiconductor structures via rewiring and interconnect layers arranged below it. Furthermore, there are fuses which are connected to individual regions of the semiconductor structures and are designed as short-circuit bridges or lines which can be interrupted.

According to the invention, the method for producing the semiconductor wafer includes the following steps. A semiconductor wafer having semiconductor chips arranged in rows and columns and saw track regions provided between them is provided. An interconnect layer, which comprises a multiplicity of interconnects which are electrically conductively connected to the electrodes of the semiconductor structures, is applied to a plane lying above the semiconductor structures. This interconnect layer is embedded in a first insulating layer, with contact surfaces in each case being left clear.

A rewiring layer is applied to a second insulating layer in a plane which lies above the interconnect layer. The rewiring layer comprises a multiplicity of electrically conductive rewiring tracks which are connected to the interconnect layer. A third insulating layer is applied to the rewiring layer and provided with second apertures. These second apertures are in each case filled with second connections made from metal in regions above the rewiring layer. At locations above column-like structures which are not connected to the rewiring layer, the columns are in each case widened upward.

An outer contact layer, which is composed of three individual layers, is applied to the entire surface of the third insulating layer and is then patterned to form outer contact surfaces and short-circuit lines and also, if appropriate, rewiring lines.

Then, a passivation layer is applied over the third insulating layer and the outer contact layer and is partially opened up toward the outer contact layer below it and the horizontal short-circuit lines. Outer contacts or contact bumps are applied to the outer contact layer at the locations which have been opened up above the outer contact surfaces.

The functions of the semiconductor structures are then tested. Depending on the requirements, it is then possible for predetermined short-circuit lines to be interrupted, for example by means of the application of an external overvoltage or by means of a material-removing laser beam.

Then, the semiconductor wafer can be separated into semiconductor chips.

With this method according to the invention it is possible, in a very advantageous way, to process a semiconductor wafer to form finished semiconductor chips which can then be mounted directly—i.e., without any further intermediate steps, for example for production of outer contacts or the like—on higher-level circuit carriers, printed circuit boards or the like. The opening of individual short-circuit lines (what is known as "blowing") of fuses can still take place at the semiconductor wafer and can then immediately be followed by the separation into semiconductor chips. The configuration of the outer contact layer then merely needs to be adapted in punctiform manner to the profile of the rewiring layer, specifically at the vertical connection locations, the second connections. Therefore, the outer contacts can be positioned relatively independently of the interconnect profiles of the rewiring structure.

In accordance with an added feature of the invention, the three individual layers of the outer contact layer are formed by applying three metallic layers to the entire surface of the semiconductor wafer. A lower individual layer preferably includes aluminum or an Al alloy. This lower individual layer serves primarily as a conducting layer and therefore has a greater layer thickness than the two individual layers applied to it. A middle individual layer of copper and/or a Cu alloy is applied to this lower individual layer and is used primarily to inhibit diffusion. The solder on the outer contact surface is prevented from diffusing into the conducting layer of Al. An upper layer preferably includes nickel and/or a Ni alloy. The upper layer of the outer contact layer is used primarily to improve the flow and bonding of the solder on the outer contact surface.

In accordance with an additional feature of the invention, the three individual layers of the outer contact layer are applied by way of sputtering. In this way, if necessary, patterning can be carried out at an early stage (by what is known as mask sputtering). An alternative option consists in applying the metallic layers by means of vapor deposition, so that a uniform layer thickness can be achieved.

A particularly suitable passivation layer for application to the outer contact layer is nickel oxide and/or polyimide, which serve in particular as a soldering stop layer and prevent solder material of the outer contacts from wetting the rewiring lines of the outer contact layer.

The through-openings in the passivation layer for application of the outer contacts or of the bumps can, according to a further embodiment of the invention, be produced by means of a photolithographic exposure method and subsequent etching. In this way, the through-openings can be dimensioned and positioned accurately.

Particularly suitable outer contacts are contact bumps which are applied to the outer contact surfaces.

According to a further embodiment of the invention, the contact bumps consist of solder paste and are applied in a printing process. This method allows accurate positioning and portioning of the contact bumps required for the outer contacts.

According to a further configuration of the method according to the invention, the contact bumps are applied as a cylinder section and are remelted to form rounded beads in a subsequent soldering process.

A further option provides for the semiconductor wafer to be thinned, for example by grinding or etching, before it is separated into individual semiconductor chips. This thinning may optionally take place before or after the application of the outer contacts and the opening of the short-circuit lines.

To summarize, the following aspects of the invention result. During the production of outer contacts on a semiconductor wafer, an additional metallization plane is formed, which is referred to in the present context as an outer contact layer and the purpose of which consists in what is known as rerouting of a rewiring level lying below it to the outer contacts of the semiconductor chip. What this means is formation of connections, known as interconnects, between a rewiring layer, which lies at a lower level than the outer contact layer, on the semiconductor wafer and the contact bumps which are subsequently to be applied.

With the above and other objects in view there is also provided, in accordance with the invention, an electronic component, comprising:

a semiconductor chip having semiconductor structures on an active front surface thereof;

outer contacts on the front surface of the semiconductor chip for making electrical contact with a circuit carrier;

the outer contacts being disposed on a patterned outer contact layer; and interconnect layers disposed below the outer contact layer and connecting the outer contact layer to the semiconductor structures, the outer contact layer including three individual metallic layers structured to form outer contact surfaces, rewiring lines, and short-circuit lines.

The semiconductor chip may be present either in singled form after dicing, or it may be present as an intermediate electronic component product in the form of a wafer prior to dicing.

The semiconductor chips of the semiconductor wafer which is to be separated into individual chips are provided with what are known as fuses which, in the same plane as the outer contact layer, have horizontal short-circuit bridges which are disconnected as required.

By way of example, standard aluminum (or an Al alloy) can be used as base material for this outer contact layer and is applied as a uniform layer and on which a significantly thinner layer of copper (or a Cu alloy) and a further thin layer of nickel (or an Ni alloy) are subsequently deposited. For this purpose, first of all aluminum is deposited over the entire surface of the wafer. The outer contact layer of Cu and Ni is deposited on certain regions of this seed layer by means of a photolithographic and electrodeposition process. The coating with the seed layer may, for example, be carried out in sputtering or vapor deposition installations. If appropriate, the CuNi layer may also be deposited on only part of the seed layer, for example by mask sputtering.

After the outer contact layer has been produced in this way, it is covered by a passivation layer which is deposited over the entire surface of the wafer. This passivation layer may consist, for example, of polyimide and/or of $NiO_x$. The passivation layer is partially opened up likewise by means of a photolithographic process with subsequent etching, with the result that apertures leading to the outer contact layer below and to the short-circuit bridges of the fuses are formed. Then, contact bumps are applied to the rewiring layer in the apertures above outer contact surfaces. These bumps consist, for example, of solder paste and can be applied with the aid of a printing process; i.e. a cylindrical contour is printed onto what are known as the landing areas. In the course of a subsequent reflow process, the material (for example (SnPb—a tin/lead alloy) is in each case remelted to form a rounded bead.

The through-openings above the short-circuit bridges make it possible to disconnect some of these short-circuit bridges after the functions of the semiconductor structures have been tested.

Other features which are considered as characteristic for the invention are set forth in the appended claims.

Although the invention is illustrated and described herein as embodied in a method for producing a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 11 are diagrammatic cross sections showing, in ascending order, successive process steps of a production method according to the invention. Briefly, a semiconductor wafer 2 has, applied to it, an interconnect layer 4, rewiring layer 16 and outer contact layer 22.

Throughout the figures, identical parts are provided with identical reference symbols; therefore, in some cases they are not explained repeatedly.

DESCRIPTION OF THE PREFERRED EMBODIMENTS

The process sequences of coating and contact-making on the wafer surface which are explained below by way of example with reference to the semiconductor wafer 2 may equally well be carried out on semiconductor chips. The following explanations relate to semiconductor wafers, but the invention also extends to cover individual semiconductor chips which have been produced by separating semiconductor wafers into individual chips.

Figure 1:
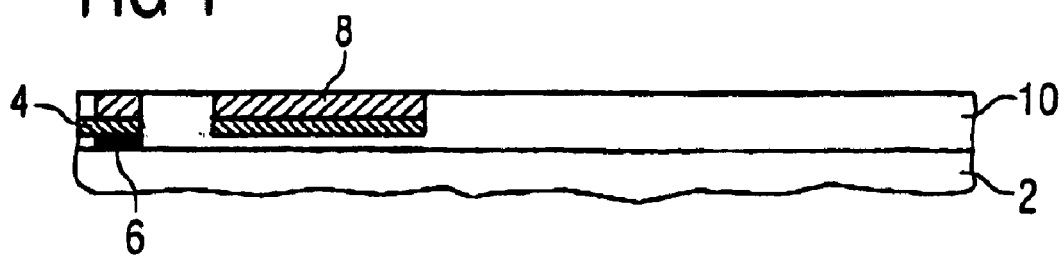

Referring now to the figures of the drawing in detail and first, particularly, to FIG. 1 thereof, there is shown a first diagrammatic partial cross section through a semiconductor wafer 2 with a first insulating layer 10 which has been applied to the surface of its semiconductor structures. This first insulating layer 10 may, for example, consist of silicon nitride or another suitable insulating material. The active front surface of the semiconductor wafer 2 with semiconductor structures which have been applied to it has a microscopically patterned electrode connecting layer which is electrically conductively connected to an interconnect layer 4 via a multiplicity of first connections 6. The interconnect layer 4 comprises a plurality of microscopic interconnect structures which are used to make electrical contact with the semiconductor structures of the semiconductor wafer 2. On a surface of the interconnect layer 4 that is remote from the first connection 6, i.e., that faces away, there is a contact surface 8 which is embedded in the first insulating layer 10 and the surface of which is no longer covered by the first insulating layer 10.

Next to the contact surface 8 and spatially separated from it by the first insulating layer 10 there is a further, smaller metallic surface which is later built up and patterned into a fuse.

Figure 2:
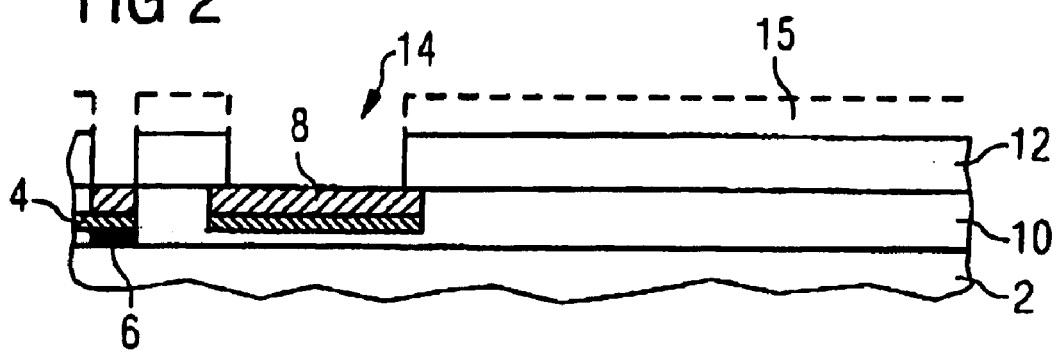

FIG. 2 shows a further diagrammatic cross section through a second insulating layer 12, which is applied to the first insulating layer 10 in a further process step and has a first aperture 14 for making further contact with the interconnect layer 4. The first aperture 14 may be produced, for example, by etching. A similar aperture is located above the metallic surface provided for the fuse. A first photoresist layer 15 has been applied to the second insulating layer 12 for this purpose. The gaps in the first photoresist 15 are formed by exposure and developing and form the apertures 14.

Figure 3:
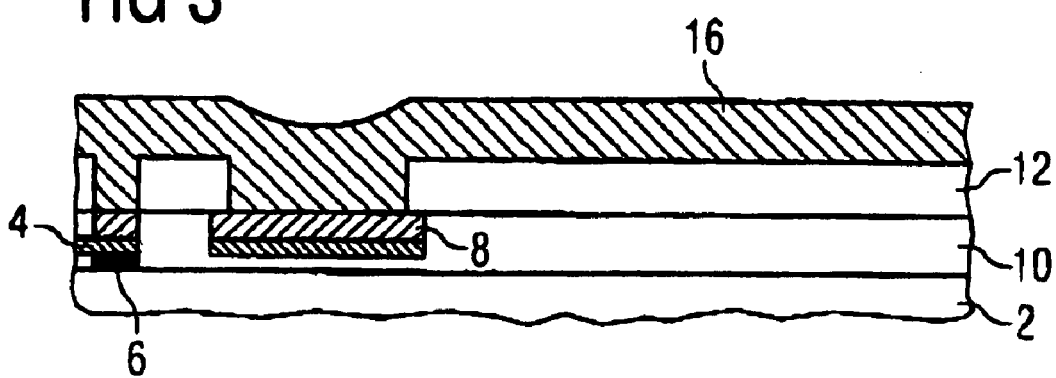
Figure 4:
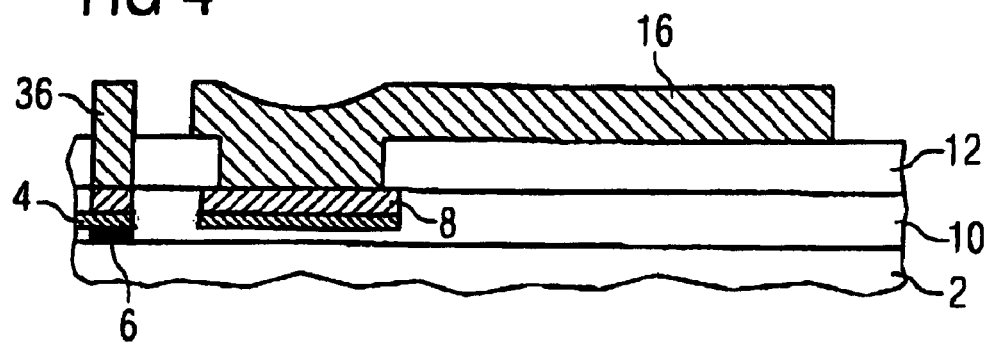

Then, a metallic layer, which may consist, for example, of aluminum or copper, is applied (FIG. 3) to the entire surface of the second insulating layer 12 which has been patterned in this way. This metallic layer initially covers the entire surface of the wafer and is only then patterned in a photolithographic process with subsequent developing and/or etching (wet and/or dry) (FIG. 4), with the result that a rewiring layer 16 is formed. In this way, a further contact plane, which already has macroscopic orders of magnitude, is formed on the semiconductor wafer 2. It is also possible to discern the first apertures 14, which have been completely filled by the rewiring layer 16, with the result that positively locking (form-locking) and electrically conducting connections are formed (via the contact surfaces 8) between the interconnect layer 4 and the rewiring layer 16.

Figure 11:
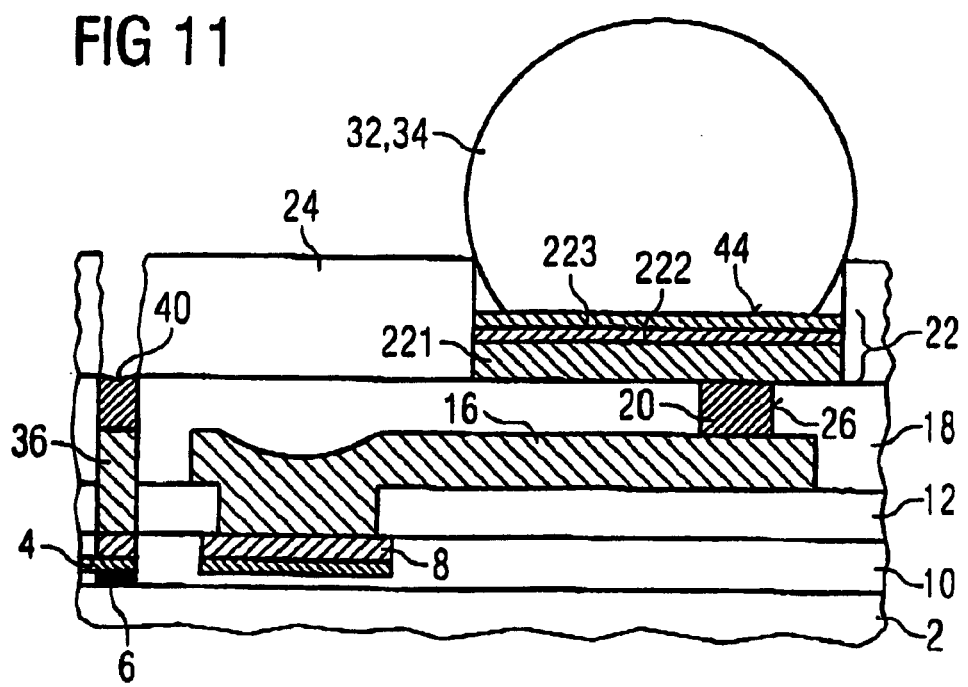

The future fuse 36 is built up further in the same way. As can be seen from FIG. 4, for this purpose in each case two column-like structures which are spaced apart from one another are formed, having their bases on sections of the interconnect layer 4 which are not connected to one another. In each case two column structures of this type are horizontally connected to one another via a short-circuit line 38 (FIG. 8), resulting in the formation of the fuse 36. These horizontal metallic connections or short-circuit lines 38 can be interrupted as required, which is referred to as "blowing" the fuse 36. FIG. 11 illustrates an interrupted short-circuit line 40 of this type. This interruption can be effected, for example, by means of a material-removing laser beam or also by the application of an increased voltage which melts the metal of the short-circuit line 38 of the fuse 36.

Figure 5:
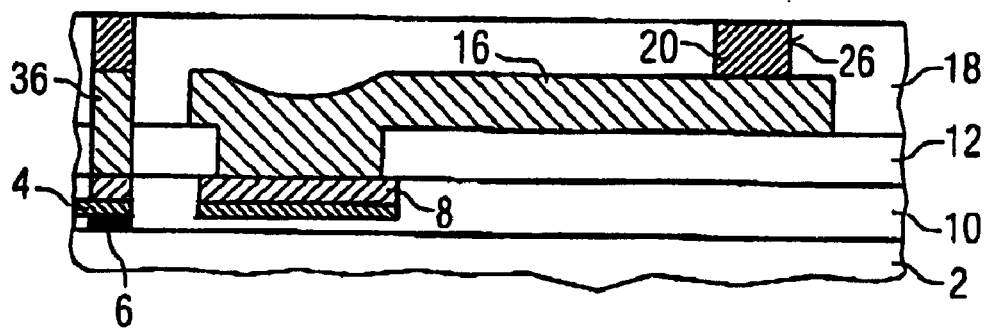

The rewiring layer 16 is then covered with a third insulating layer 18 (FIG. 5), which in turn is provided with second apertures 26 in a photolithographic process. These second apertures are filled with second connections 20 which, like the first connections 6, consist of a metallic layer which has been applied by electro-deposition or by mask sputtering. The column-like structures of the fuses 36 are built up further on the same horizontal level as the second connections 20. This takes place in the same way as the second connections 20 by electro-deposition or by mask sputtering.

Figure 6:
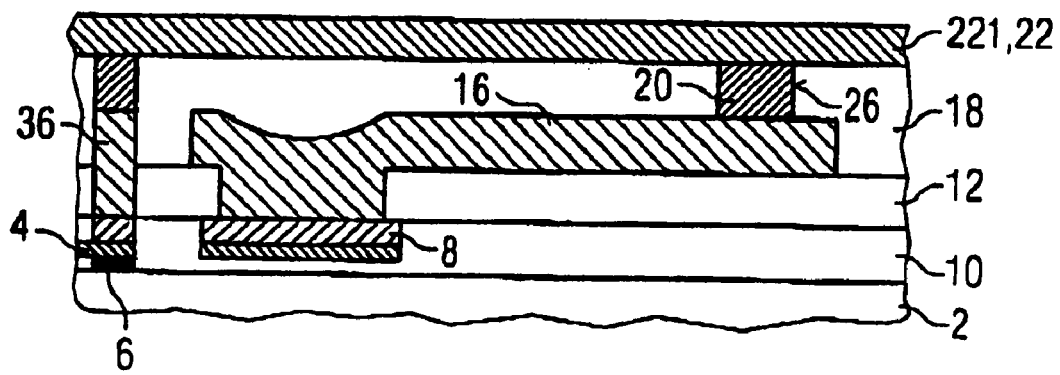

The third insulating layer 18, which completely covers the semiconductor wafer 2—apart from the second connections 20 and the fuses 36—is then covered over its entire surface with a three-layer metallic layer, known as the outer contact layer 22, of which the lower individual layer 221 can be applied, for example, by deposition of aluminum or aluminum alloy (FIG. 6). This lower individual layer 221 has a greater thickness than the middle individual layer 222 and the upper individual layer 223 (cf. FIG. 7) and is used for electrical conduction, for which reason it can also be referred to as a conducting layer.

This lower individual layer 221 of the outer contact layer 22 covers both the second connections 20 which are open in the third insulating layer 18 and the open columns of the blown fuse 36.

The lower individual layer 221 of Al or an Al alloy can be applied not only by electro-deposition but also, if desired, by means of sputtering or alternatively by means of vapor deposition.

A middle individual layer 222 of copper and/or a Cu alloy is applied to the entire surface of the lower individual layer 221 (FIG. 7); this middle individual layer can be referred to as a surface treatment layer and is responsible, inter alia, for inhibiting diffusion of the solder which is subsequently applied to outer contact surfaces 44 toward the Al conducting layer of the lower individual layer 221.

The middle individual layer 222 of the outer contact layer 22 is applied to the entire surface of the lower individual layer 221, a step which may be effected by electro-deposition, by sputtering or by vapor deposition.

An upper individual layer 223 of nickel and/or an Ni alloy is applied to the entire surface of the middle individual layer 222 (FIG. 7) and is primarily responsible for improving the flow and/or bonding of the solder applied to the outer contact surfaces 44.

The upper individual layer 223 of the outer contact layer 22 is applied to the entire surface of the middle individual layer 222, a step which can be effected by electro-deposition, by sputtering or by vapor deposition.

In a further method step, the three-layer outer contact layer 22 is patterned (cf. FIG. 8), so that outer contact surfaces 44 and short-circuit lines 38 are formed. The outer contact surface 44 of the outer contact layer 22 must in each case be positioned at locations which are conductively connected to the rewiring layer 16 via second connections 20. At the same time as the outer contact surfaces 44, the short-circuit lines 38 of the fuses 36 are patterned, these lines in each case connecting two column-like sections via a horizontal section located in the plane above the third insulating layer 18.

The outer contact layer 22 can be patterned by means of a known photolithographic method (with subsequent developing and/or etching).

Figure 10:
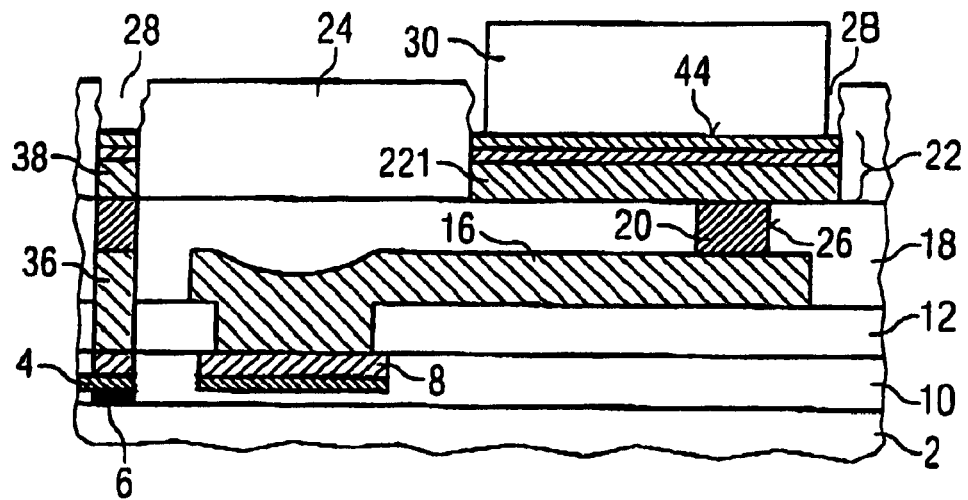

Then, a passivation layer 24 is deposited on the entire surface of the wafer (FIG. 9) and is opened up at defined locations, resulting in the formation of through-openings 28 (FIG. 10). The through-openings 28 are produced above outer contact surfaces 44 of the outer contact layer 22 and above the short-circuit lines 38 by partial removal of the passivation layer 24. The through-openings 28 above the outer contact surfaces 44 are preferably of approximately the same size as the latter and are used to produce outer contacts 34, by means of which the semiconductor chips which have been separated from the semiconductor wafer 2 can be mounted on interconnects of a higher-level circuit carrier or the like.

The through-openings 28 are usually also produced by means of a photolithographic process with subsequent exposure and developing and if appropriate with an etching step (wet/dry).

FIG. 10 also shows solder paste cylinders 30 which have been introduced into the through-openings 28 and may consist of solder paste (for example of SnPb) and can be applied, for example, with the aid of a printing process. For this purpose, portions of solder paste which are in each case structured in the shape of a cylinder are printed onto the outer contact surfaces 44 (known as landing areas) of the outer contact layer 22, these portions forming the solder paste cylinders 30 and being remelted to form rounded beads or contact bumps 32 during a reflow process (FIG. 11). These bumps 32 form the actual outer contacts 34 of the semiconductor chip.

After this process step, the semiconductor structures of the semiconductor wafer are accessible to a test method, in which the functions of the semiconductor structures can be tested. In this context, redundant modules which are required are added in order to replace defective structure sections. This is achieved by interrupting defined short-circuit lines 38, which is also known as "blowing" fuses 36. As indicated in FIG. 11, some of these short-circuit lines 38 are interrupted in the case of a "blown" fuse 36 (interrupted short-circuit line 40).

The short-circuit lines 38 can be interrupted by means of an electric voltage surge or by means of a laser beam.

The description of the exemplary embodiments of the invention primarily refer to the production of semiconductor wafers 2. It will be understood that the wafer is subsequently separated or diced into individual semiconductor chips, typically by sawing along a saw track region, i.e., along a kerf. It is optionally also possible for the semiconductor wafer 2 to be thinned, for example by etching or grinding, before being separated into individual chips. This thinning may optionally take place before or after the application of the outer contacts 34.

I claim:

1. A method for producing a semiconductor wafer having an active front surface provided with semiconductor structures and having a passive back surface without semiconductor structures, and having external contacts on the active front surface for electrically contacting semiconductor chips separated from the semiconductor wafer with contact surfaces of a circuit board or another circuit carrier, the outer contacts being formed on a metallic outer contact layer connected to semiconductor structures via underlying rewiring layers and interconnect layers, and the semiconductor structures having fuses formed as interruptible short circuit lines, the method which comprises:

providing a semiconductor wafer having semiconductor structures arranged in rows and columns and kerf regions therebetween;

forming an interconnect layer on a plane above the semiconductor structures, the interconnect layer having a multiplicity of interconnects connected to electrodes of the semiconductor structures;

embedding the interconnect layer in a first insulating layer, leaving clear contact surfaces;

applying a rewiring layer in a plane above the interconnect layer, on a structured, second insulating layer, comprising a multiplicity of rewiring tracks connected to the interconnect layer;

applying a third insulating layer having apertures;

filling the apertures with metal;

applying a three-layer outer contact layer composed of three individual layers;

patterning the three-layer outer contact layer to form outer contact surfaces and short-circuit lines;

applying a passivation layer over the third insulating layer and the outer contact layer;

partly opening the passivation layer to the underlying outer contact layer to uncover the outer contact surfaces and the short-circuit lines;

applying outer contacts to the outer contact surfaces;

functionally testing the semiconductor structures and interrupting short-circuit lines having been detected; and separating the semiconductor wafer into semiconductor chips.

2. The method according to claim 1, which comprises forming the three individual layers of the outer contact layer by applying three metallic layers to an entire surface of the semiconductor wafer.

3. The method according to claim 1, which comprises forming a lower layer of the outer contact layer with aluminum or an aluminum alloy.

4. The method according to claim 1, which comprises forming an upper layer of the outer contact layer with nickel or a nickel alloy.

5. The method according to claim 1, which comprises forming the individual layers of the outer contact layer by sputtering.

6. The method according to claim 1, which comprises forming the individual layers of the outer contact layer by vapor deposition.

7. The method according to claim 1, which comprises forming through-openings in the passivation layer or application of the outer contacts photolithography.

8. The method according to claim 1, which comprises forming through-openings in the passivation layer for application of the outer contacts photolithography and subsequently etching the through-openings.

9. The method according to claim 1, which comprises printing the outer contacts or contact bumps in the form of cylinder sections and remelting the cylinder sections to form rounded beads during a subsequent soldering process.

10. An electronic component, comprising:

a semiconductor chip having semiconductor structures on an active front surface thereof;

outer contacts on said front surface of said semiconductor chip for making electrical contact with a circuit carrier;

said outer contacts being disposed on a patterned outer contact layer;

an interconnect layer and a rewiring layer disposed below said outer contact layer and connecting said outer contact layer to said semiconductor structures, said outer contact layer including three individual metallic layers structured to form outer contact surfaces and short-circuit lines; and a passivation layer disposed on said outer contact layer, said passivation layer including through openings above and exposing said outer contact surfaces and said short-circuit lines.

11. The electronic component according to claim 10, wherein said outer contact layer includes a lower individual layer formed with at least one of aluminum and an aluminum alloy.

12. The electronic component according to claim 10, wherein said outer contact layer includes an upper individual layer formed with at least one of nickel and a nickel alloy.

13. The electronic component according to claim 10, wherein said outer contact layer includes a middle individual layer formed with at least one of copper and a copper alloy.

14. The electronic component according to claim 10, wherein said passivation layer includes at least one of polyimide and nickel oxide.

15. The electronic component according to claim 10, wherein said outer contacts include a solder alloy of a solder paste.

16. An intermediate electronic component product, comprising:

a semiconductor wafer having semiconductor structures for semiconductor chips on an active front surface thereof;

outer contacts on said front surface of said semiconductor wafer for making electrical contact with a circuit carrier; said outer contacts being disposed on a patterned outer contact layer;

an interconnect layer and a rewiring layer disposed below said outer contact layer and connecting said outer contact layer to said semiconductor structures, said outer contact layer including three individual metallic layers structured to form outer contact surfaces and short-circuit lines; and a passivation layer disposed on said outer contact layer, said layer including through openings above and exposing said outer contact surfaces and said short-circuit lines.

17. The electronic component according to claim 16, wherein said outer contact layer includes a lower individual layer formed with at least one of aluminum and an aluminum alloy.

18. The electronic component according to claim 16, wherein said outer contact layer includes an upper individual layer formed with at least one of nickel and a nickel alloy.

19. The electronic component according to claim 16, wherein said outer contact layer includes a middle individual layer formed with at least one of copper and a copper alloy.

20. The electronic component according to claim 16, wherein said passivation layer includes at least one of polyimide and nickel oxide.

21. The electronic component according to claim 16, wherein said outer contacts include a solder alloy of a solder paste.

* * * * *